United States Patent
Yang et al.

(10) Patent No.: US 12,261,022 B2
(45) Date of Patent: Mar. 25, 2025

(54) SEMICONDUCTOR PROCESS APPARATUS AND PLASMA IGNITION METHOD

(71) Applicant: BEIJING NAURA MICROELECTRONICS EQUIPMENT CO., LTD., Beijing (CN)

(72) Inventors: Jing Yang, Beijing (CN); Chenyu Zhong, Beijing (CN); Gang Wei, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 57 days.

(21) Appl. No.: 18/254,055

(22) PCT Filed: Nov. 23, 2021

(86) PCT No.: PCT/CN2021/132228
§ 371 (c)(1),
(2) Date: May 23, 2023

(87) PCT Pub. No.: WO2022/111427
PCT Pub. Date: Jun. 2, 2022

(65) Prior Publication Data
US 2023/0411120 A1 Dec. 21, 2023

(30) Foreign Application Priority Data

Nov. 25, 2020 (CN) .......................... 202011336795.5

(51) Int. Cl.
*H01J 37/32* (2006.01)

(52) U.S. Cl.
CPC .. *H01J 37/32183* (2013.01); *H01J 37/32577* (2013.01); *H01J 37/32935* (2013.01); *H01J 2237/334* (2013.01)

(58) Field of Classification Search
None
See application file for complete search history.

(56) References Cited

U.S. PATENT DOCUMENTS

| 5,571,366 A * | 11/1996 | Ishii | H01J 37/3299 216/60 |
| 2004/0016402 A1 * | 1/2004 | Walther | C23C 14/48 118/723 E |

(Continued)

FOREIGN PATENT DOCUMENTS

| CN | 101499399 A | 8/2009 |
| CN | 102507003 A | 6/2012 |

(Continued)

OTHER PUBLICATIONS

The World Intellectual Property Organization (WIPO) International Search Report for PCT/CN2021/132228 Feb. 7, 2022 6 Pages (including translation).

*Primary Examiner* — Srinivas Sathiraju
(74) *Attorney, Agent, or Firm* — ANOVA LAW GROUP, PLLC (57) ABSTRACT

The present disclosure provides a semiconductor process apparatus and a plasma ignition method. The semiconductor process apparatus includes a reaction chamber, an air inlet assembly configured to introduce the reaction gas into the reaction chamber, an upper electrode assembly configured to excite the reaction gas into the plasma, a monitor configured to monitor the electromagnetic radiation intensity of the plasma in the reaction chamber when the plasma is ignited, a controller configured to determine whether the electromagnetic radiation intensity monitored by the monitor (Continued)

reaches the preset intensity, if yes, determine that the plasma ignition is successful, and after the plasma ignition is successful, control the upper electrode assembly to perform the impedance matching of the first preset duration. In the present disclosure, the consistency of the process results may be improved to improve the uniformity of the products.

11 Claims, 4 Drawing Sheets

(56) References Cited

U.S. PATENT DOCUMENTS

| | | | | |
|---|---|---|---|---|
| 2005/0011611 | A1* | 1/2005 | Mahoney | H01J 37/32935 156/345.24 |
| 2006/0032584 | A1* | 2/2006 | Itabashi | H01J 37/32183 156/345.44 |
| 2006/0086699 | A1* | 4/2006 | Holber | H01J 37/321 219/121.54 |
| 2007/0131354 | A1* | 6/2007 | Yokogawa | H01J 37/32935 257/E21.252 |
| 2009/0301655 | A1* | 12/2009 | Yokogawa | H01J 37/32972 156/345.24 |
| 2015/0348854 | A1* | 12/2015 | Kapoor | H01J 37/32935 438/10 |
| 2016/0086772 | A1* | 3/2016 | Khaja | H01J 37/3211 315/111.21 |
| 2016/0111259 | A1* | 4/2016 | Van Zyl | H01J 37/32935 315/111.21 |
| 2016/0168701 | A1* | 6/2016 | Kapoor | H01J 37/32899 118/663 |
| 2017/0098527 | A1* | 4/2017 | Kawasaki | H01J 37/32082 |
| 2017/0117869 | A1* | 4/2017 | Leeser | H01J 37/32183 |
| 2018/0163302 | A1* | 6/2018 | Kapoor | H01J 37/32935 |
| 2018/0277377 | A1* | 9/2018 | Eto | H01J 37/32009 |
| 2019/0080886 | A1* | 3/2019 | Kaplan | H05B 6/686 |
| 2019/0085448 | A1* | 3/2019 | Phillips | C23C 16/345 |
| 2020/0035461 | A1* | 1/2020 | Bhutta | H01L 21/31116 |
| 2020/0299838 | A1* | 9/2020 | Phillips | H01L 21/0217 |
| 2020/0343074 | A1* | 10/2020 | Alizadeh | H05H 1/4697 |
| 2021/0098233 | A1* | 4/2021 | Kapoor | G01R 19/0084 |
| 2022/0367149 | A1* | 11/2022 | Funk | H01J 22/20 |
| 2023/0096723 | A1* | 3/2023 | Okamoto | H01L 21/67 438/9 |
| 2023/0411120 | A1* | 12/2023 | Yang | H01J 37/32183 |

FOREIGN PATENT DOCUMENTS

| | | |
|---|---|---|
| CN | 108735568 A | 11/2018 |
| CN | 112466732 A | 3/2021 |
| KR | 101591961 B1 | 2/2016 |
| KR | 101677748 B1 | 11/2016 |

\* cited by examiner

SEMICONDUCTOR PROCESS APPARATUS AND PLASMA IGNITION METHOD

CROSS-REFERENCE TO RELATED APPLICATIONS

This application is a national phase entry under 35 U.S.C. § 371 of International Application No. PCT/CN2021/132228, filed on Nov. 23, 2021, which claims priority to Chinese Application No. 202011336795.5 filed on Nov. 25, 2020, the entire contents of both of which are incorporated herein by reference.

TECHNICAL FIELD

The present disclosure generally relates to the semiconductor processing technology field and, more particularly, to a semiconductor process apparatus and a plasma ignition method.

BACKGROUND

Currently, a process of semiconductor manufacturing using a plasma apparatus is widely used. Taking an etching process for example, a general process mainly includes a radio frequency (RF) matching step and an etching step. In the RF matching step, the RF mechanism is configured to apply an electromagnetic field to a reaction chamber to excite a reaction gas into a plasma and perform impedance matching to adjust the reflected power. When the reflected power of the RF mechanism reaches a target reflected power, the process enters the etching step to etch a wafer.

However, for the above etching process, the duration of the RF matching step cannot be determined due to impacts of various factors (e.g., fluctuation of an ignition duration and an impedance matching duration). Thus, a difference in the durations of the RF matching step exists for different wafers. When the difference is large, a process result is changed, which affects product uniformity.

SUMMARY

The present disclosure aims to solve at least one of the technical problems existing in the existing technology and provides a semiconductor process apparatus and a plasma ignition method, which may ensure the consistency of the process results of different wafers to improve the uniformity of products.

To realize the above purpose, the present disclosure provides a semiconductor process apparatus, including:
  a reaction chamber;
  an air inlet assembly configured to introduce a reaction gas into the reaction chamber;
  an upper electrode assembly configured to excite the reactive gas into a plasma;
  a monitor configured to monitor an electromagnetic radiation intensity of the plasma in the reaction chamber when the plasma is ignited; and
  a controller configured to determine whether the electromagnetic radiation intensity monitored by the monitor reaches a preset intensity, if yes, determine that plasma ignition is successful, and after the plasma ignition is successful, control the upper electrode assembly to perform impedance matching of a first preset duration.

In some embodiments, the semiconductor process apparatus further includes:
  a lower electrode assembly configured to apply a radio frequency (RF) bias voltage to a chuck in the reaction chamber.

The controller is further configured to, after controlling the upper electrode assembly to perform the impedance matching of the first preset duration, control the lower electrode assembly to apply the RF bias voltage to the chuck, and control the lower electrode assembly to perform impedance matching of a second preset duration.

In some embodiments, the monitor is configured to generate an analog signal that is positively correlated with the electromagnetic radiation intensity according to the electromagnetic radiation intensity of the plasma in the reaction chamber.

The controller is configured to determine whether the analog signal generated by the monitor within a preset monitor duration is continuously greater than a preset threshold, and if yes, determine that the electromagnetic radiation intensity of the plasma in the reaction chamber reaches a preset intensity.

In some embodiments, the preset monitor duration is greater than or equal to 200 ms and less than or equal to 1000 ms.

In some embodiments, a ratio of the preset intensity to a target intensity is greater than or equal to 1:10, and the target intensity is the electromagnetic radiation intensity reached by the plasma after the impedance matching of the upper electrode assembly is completed.

In some embodiments, a monitor window is arranged on a sidewall of the reaction chamber, the monitor is arranged outside the reaction chamber, and the monitor is configured to monitor the electromagnetic radiation intensity of the plasma in the reaction chamber through the monitor window.

The present disclosure further provides a plasma ignition method, applied to the above semiconductor process apparatus. The plasma ignition method includes:
  introducing the reaction gas into the reaction chamber, and exciting the reaction gas into the plasma through the upper electrode assembly;
  monitoring the electromagnetic radiation intensity of the plasma in the reaction chamber;
  determining whether the electromagnetic radiation intensity of the plasma in the reaction chamber reaches the preset intensity, and if yes, determining that the plasma ignition is successful; and
  after the plasma ignition is successful, controlling the upper electrode assembly to perform the impedance matching of the first preset duration.

In some embodiments, the plasma ignition method further includes:
  after controlling the upper electrode assembly to perform the impedance matching of the first preset duration, applying the RF bias voltage to the chuck in the reaction chamber through the lower electrode assembly, and controlling the lower electrode assembly to perform the impedance matching of the second preset duration.

In some embodiments, monitoring of the electromagnetic radiation intensity of the plasma in the reaction chamber includes, according to the electromagnetic radiation intensity of the plasma in the reaction chamber, generating the analog signal that is positively correlated with the electromagnetic radiation intensity.

Determining whether the electromagnetic radiation intensity of the plasma in the reaction chamber reaches the preset intensity includes determining whether the analog signal is continuously greater than a preset threshold within the preset monitor duration, and if yes, determining that the electromagnetic radiation intensity of the plasma in the reaction chamber reaches the preset intensity.

In some embodiments, the preset monitor duration is greater than or equal to 200 ms and less than or equal to 1000 ms.

The present disclosure includes the following beneficial effects.

In the semiconductor process apparatus of the present disclosure, the electromagnetic radiation intensity of the plasma in the reaction chamber may be monitored by the monitor. Since the electromagnetic radiation intensity of the plasma may be monitored more directly, whether the plasma ignition is successful may be more quickly and accurately monitored. After the plasma ignition is successful, the upper electrode assembly may be controlled to perform the impedance matching of the first preset duration. Thus, the plasma ignition may be ensured to be successful before the impedance matching of the first preset duration is performed. Thus, the consistency of the etching effect of different wafers may be ensured.

BRIEF DESCRIPTION OF THE DRAWINGS

The accompanying drawings are used to provide a further understanding of the present disclosure and form a part of the specification. The accompanying drawings are used to explain the present disclosure with embodiments below and do not limit the present disclosure.

DETAILED DESCRIPTION OF THE EMBODIMENTS

Specific embodiments of the present disclosure are described in detail in connection with the accompanying drawings. It should be understood that the specific embodiments described here are merely used to illustrate and explain the present disclosure and do not limit the present disclosure.

Unless otherwise defined, technical terms or scientific terms used in embodiments of the present disclosure have the common meaning as understood by those of ordinary skill in the art to which the present disclosure belongs. The terms "first," "second," and similar terms used here do not represent any order, quantity, or importance, but are merely used to distinguish different components. Similarly, a word like "comprising" or "including" means that elements or things appearing before the word include the elements or things that appear after the word and their equivalents, and other elements or things are not excluded. A word like "connected" or "coupled" is not limited to a physical connection or a mechanical connection, but may include an electrical connection, no matter direct or indirect. "Up," "Down," "Left," "Right," etc. are only used to represent the relative positional relationship, and when the absolute position of the described object changes, the relative positional relationship may also change accordingly.

Figure 1:
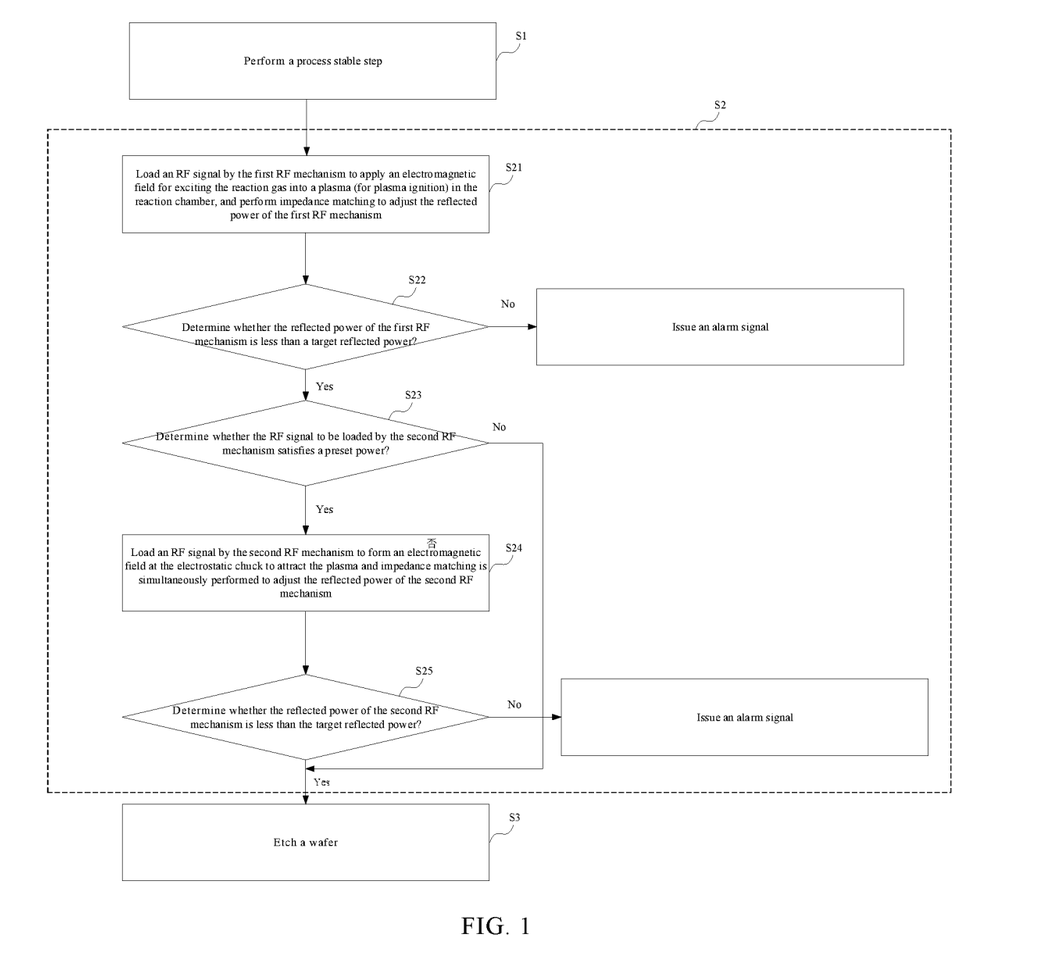
FIG. 1 illustrates a schematic flowchart of a plasma etching process according to an embodiment of the present disclosure.

In one example, a semiconductor processing apparatus may include a reaction chamber, a first radio frequency (RF) mechanism arranged at a top of the reaction chamber, and a second RF mechanism and an electrostatic chuck arranged at a bottom of the reaction chamber. FIG. 1 illustrates a schematic flowchart of a plasma etching process according to an embodiment of the present disclosure. As shown in FIG. 1, the etching process includes the following processes.

At S1, a process stable step is performed. The process stable step specifically includes introducing a reaction gas into the reaction chamber, controlling an exhaust gas volume through a swing valve on an exhaust pipeline to adjust a pressure in the reaction chamber to a target pressure, and adjusting a temperature of the electrostatic chuck to a target temperature.

When parameters such as the pressure in the reaction chamber, the temperature of the electrostatic chuck tend to be stable, the process enters an RF matching step S2. The RF matching step S2 specifically includes the following processes.

At S21, the first RF mechanism loads an RF signal to apply an electromagnetic field for exciting the reaction gas into a plasma (for plasma ignition) in the reaction chamber, and impedance matching is performed to adjust the reflected power of the first RF mechanism.

At S22, whether the reflected power of the first RF mechanism is less than a target reflected power (for example, 20 W) is determined. If yes, step S23 is performed, and if no, an alarm signal is issued.

At S23, whether the RF signal to be loaded by the second RF mechanism satisfies a preset power (for example, greater than 5 W) is determined. If yes, step S24 is performed, and if not, step S3 is performed.

At S24, the second RF mechanism loads an RF signal to form an electromagnetic field at the electrostatic chuck to attract the plasma, and impedance matching is simultaneously performed to adjust the reflected power of the second RF mechanism.

At S25, whether the reflected power of the second RF mechanism is less than the target reflected power is determined. If yes, step S3 is performed, and if no, an alarm signal is issued.

At S3, the wafer is etched.

It should be noted that, in this example, the target reflected power of the first RF mechanism and the target reflected power of the second RF mechanism may be the same or different, which is not limited here.

In addition, in the RF matching step S2, in addition to determining whether the reflected power of the first RF mechanism and the reflected power of the second RF mechanism are smaller than the target reflected power, whether other parameters meet respective setting conditions of the other parameters may also be determined. The other parameters may include the pressure in the reaction chamber, the temperature at the electrostatic chuck, and the current ratio between the inner and outer RF coils in the first RF mechanism. When the above parameters satisfy the respective setting conditions, the process may enter step S3 to etch the wafer.

The preset current ratio in the inner and outer RF coils in the first RF mechanism may refer to a ratio of the current value I1 of the inner radio frequency coil to a sum I2 of the current value of the inner RF coil and the outer RF coil. The setting condition of the ratio, for example, may include determining whether the ratio is within a range of 0.5±0.1.

In this example, a duration of step S3 (that is, the etching step, which is clearly stated below that the step of etching the wafer is referred to as the etching step) may be a fixed value. The duration may be determined by a target etching shape of the wafer and a target etching rate. The duration of the RF matching step S2 may be a sum of a plasma ignition duration and an impedance matching duration. The sum is variable. The plasma ignition duration and the impedance matching duration may be difficult to determine. Thus, the duration of the RF matching step S2 may be difficult to determine. According to statistics, for a same etching process, a difference in the durations of the RF matching step S2 between different wafers may reach 2 seconds, while a total duration of the etching process is generally only about 12 seconds. Thus, the difference in the duration may take a large proportion of the total duration of the etching process, which may seriously affect a result of the etching process. Thus, consistency of process results of different wafers may be poor, which further affects product uniformity.

For example, for the same etching process, when the etching process is performed on a certain wafer, the duration of the RF matching step S2 may be 2 seconds, and the duration of the etching step S3 may be 10 seconds. Thus, the total duration of the etching process may be 12 seconds. When another wafer is etched, due to the difference in the plasma ignition duration or the impedance matching duration, the duration of the RF matching step S2 may become 4 seconds, while the duration of the etching step S3 may be still 10 seconds. Thus, the total duration of the etching process may be 14 seconds. In this way, two etching processes with different durations may cause the two wafers to have different process results, which further affects product uniformity.

Figure 2:
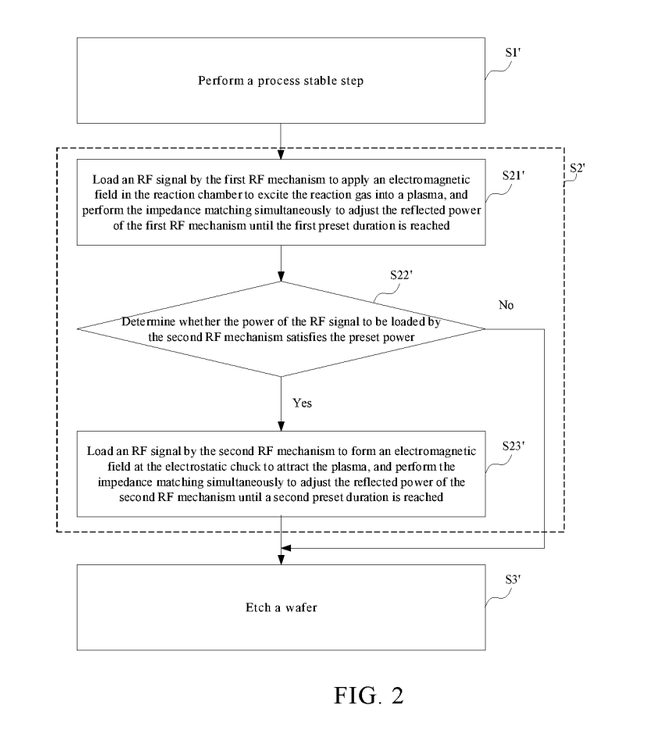
FIG. 2 illustrates a schematic flowchart of another plasma etching process according to an embodiment of the present disclosure.

FIG. 2 illustrates a schematic flowchart of another plasma etching process according to an embodiment of the present disclosure. As shown in FIG. 2, in this example, the etching process includes the following processes.

At S1', a process stable step is performed.

In this example, the process stable step may be the same as the process stable step in the etching process shown in FIG. 1, which is not repeated here. A difference between the process flows in FIG. 2 and FIG. 1 is that, in the process flow shown in FIG. 2, an RF matching step S2' has a fixed duration. Therefore, the RF matching step S2' is mainly described in this example. Specifically, the RF matching step S2' specifically includes the following processes.

At S21', the first RF mechanism loads an RF signal to apply an electromagnetic field in the reaction chamber to excite the reaction gas into a plasma, and the impedance matching is performed simultaneously to adjust the reflected power of the first RF mechanism until the first preset duration is reached, and after reaching the first preset duration, step S22' is performed.

At S22', whether the power of the RF signal to be loaded by the second RF mechanism satisfies the preset power is determined. If yes, step S23' is performed, and if no, step S3' is performed.

At S23', the second RF mechanism loads an RF signal to form an electromagnetic field at the electrostatic chuck to attract the plasma, and the impedance matching is performed simultaneously to adjust the reflected power of the second RF mechanism until a second preset duration is reached, and after reaching the second preset duration, step S3' is performed.

At S3', the wafer is etched.

Compared to the etching process shown in FIG. 1, in the etching process of this example, determining whether the reflected power of the first RF mechanism/the second RF mechanism is less than the target reflected power is no longer used as a condition to determine whether to enter the etching process S3'. The duration of step S21' and the duration of step S23' each may be set as a fixed duration. Thus, the RF matching step S2' may also have a fixed duration. After the duration of the RF matching step S2' reaches the fixed duration, the process may enter the etching step S3'. In this way, the total duration of the etching process may be set to a fixed value. Thus, the problem of inconsistent etching process results for different wafers may be improved.

However, the inventor found in the research that a main factor causing the difference in the process results for different wafers may be the duration in which the plasma lasts in the reaction chamber. With the etching process shown in FIG. 2, although the total duration of the etching process may be the fixed value, in the etching processes of different wafers, the durations in which the plasma lasts may be different.

Specifically, in the reaction chamber, the plasma may only occur after successful ignition. However, in the etching process shown in FIG. 2, plasma ignition occurs in the RF matching step S2'. Since the RF matching step S2' has a fixed duration, a duration of the plasma ignition may directly determine the duration in which the plasma lasts. That is, in the etching process shown in FIG. 2, in the RF matching step S2', the shorter the duration of the plasma ignition, the longer the duration in which the plasma lasts. The longer the duration of the plasma ignition is, the shorter the duration in which the plasma lasts. However, the duration of the plasma ignition may be affected by various factors (such as the pressure of the reaction gas in the reaction chamber, the type of the reaction gas, and the power of the RF signal, etc.), which causes the duration of the plasma ignition to be difficult to determine. Thus, in the RF matching step S2', the duration in which the plasma lasts may also be difficult to determine. As described above, the difference in the durations in which the plasma lasts is the main reason to cause the difference in the process results for different wafers. Thus, with the etching process shown in FIG. 2, the uniformity of the process results of the different wafers is still difficult to be ensured. More important, the uncertainty of the duration of the ignition may even cause a failure in the etching process. For example, in the RF matching step S2', if the duration of the plasma ignition is extended unintentionally (e.g., ignition failure), the process may enter the etching process S3' without completing the impedance matching. Thus, the reflected power of the first RF mechanism/the second RF mechanism may be still high, and the plasma in the reaction chamber may still be unstable, which affects the process results and causes a process failure in a serious situation.

Figure 3:
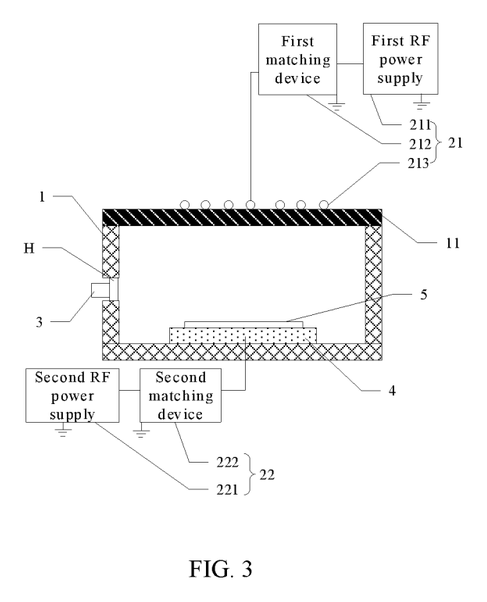
FIG. 3 illustrates a schematic diagram of a semiconductor process apparatus according to an embodiment of the present disclosure.

Based on this, embodiments of the present disclosure provide a semiconductor process apparatus. FIG. 3 illustrates a schematic diagram of a semiconductor process apparatus according to an embodiment of the present disclosure. As shown in FIG. 3, the semiconductor process apparatus includes a reaction chamber 1, an air inlet assembly (not shown in the figure), an upper electrode assembly 21, a monitor 3, and a controller (not shown in the figure). The air inlet assembly may be configured to introduce the reaction gas into the reaction chamber 1. The upper electrode assembly 21 may be configured to excite the reaction gas into the plasma. The monitor 3 may be configured to monitor the electromagnetic radiation intensity of the plasma in the reaction chamber 1 when the plasma is ignited. The controller may be configured to determine whether the electromagnetic radiation intensity monitored by the monitor 3 reaches the preset intensity, and if yes, determine that the plasma ignition is successful. After the plasma is successfully ignited, the upper electrode assembly 21 may be controlled to perform the impedance matching of a first preset duration.

In embodiments of the present disclosure, the process stable step may need to be performed before the plasma ignition is performed, which is the same as the process stable step shown in FIG. 1, which is not repeated here. When the plasma is ignited, the reaction gas may be introduced into the reaction chamber 1 by the air inlet assembly. The electromagnetic field may be applied to the reaction chamber 1 through the upper electrode assembly 21 to excite the reaction gas into the plasma. During this process, the monitor 3 may monitor the electromagnetic radiation intensity of the plasma in the reaction chamber 1. The controller may be configured to determine whether the electromagnetic radiation intensity monitored by the monitor 3 reaches the preset intensity to determine whether the plasma ignition is successful. When the controller determines that the plasma ignition is successful, the controller may control the upper electrode assembly 21 to perform the impedance matching of the first preset duration.

When the first preset duration is reached, the plasma etching may be performed on the wafer. The duration of performing the plasma etching on the wafer may be a fixed value. The duration may be determined by a target etching topography of the wafer and a target etching rate. Specifically, the plasma in the reaction chamber 1 may be used to bombard the surface of the wafer 5 to break chemical bonds of the semiconductor material on the wafer 5. Thus, the semiconductor material of the wafer 5 that needs to be etched may react with the reaction gas to generate a volatile substance to separate from the wafer 5.

In the semiconductor process apparatus of embodiments of the present disclosure, the electromagnetic radiation intensity of the plasma in the reaction chamber 1 may be monitored by the monitor 3. The status of the plasma may be more directly detected by monitoring the electromagnetic radiation intensity of the plasma instead of obtained indirectly by detecting the voltage signals or current signals of the front end of the inner and outer RF coils. Thus, by monitoring the electromagnetic radiation intensity of the plasma, whether the plasma ignition is successful may be more quickly and accurately monitored. After the plasma is successfully ignited, the impedance matching of the first preset duration may be performed. Thus, before the impedance matching is performed, the plasma ignition may be ensured to be successful. After the plasma ignition is successful, the plasma will inevitably appear in the reaction chamber 1. Thus, since the duration of the impedance matching and the duration of the subsequent etching have fixed values, in the whole etching process, the duration in which the plasma lasts in the reaction chamber may be fixed. Thus, the consistency of the process results for different wafers may be ensured.

The semiconductor process apparatus of embodiments of the present disclosure is described in detail below. In embodiments of the present disclosure, the upper electrode assembly 21 may include a first RF power supply 211, a first matching device 212, and an RF coil 213. The first RF power supply 211 may be electrically connected to the RF coil 213 through the first matching device 212. The RF coil 213 may be arranged above a dielectric window 11 at the top of the reaction chamber 1. The first RF power supply 211 may be configured to load the RF power to the RF coil 213. Thus, the RF coil 213 may apply the electromagnetic field in the reaction chamber 1 to excite the reaction gas into the plasma. The first matching device 212 may be configured to perform the impedance matching.

In embodiments of the present disclosure, when the impedance matching is performed on the upper electrode assembly 21, the target reflected power of the upper electrode assembly 21 may be set according to actual needs. For example, the target reflected power of the upper electrode assembly 21 may be set to 20 W, 10 W, or even 5 W. The first preset duration may be a fixed value. The specific value of the first preset duration may be set according to actual needs. However, the value should be greater than or equal to the maximum duration required by the upper electrode assembly 21 to adjust the reflected power to a range smaller than the target reflected power.

Specifically, since the impedance matching of the upper electrode assembly 21 is affected by various factors (for example, the pressure of the reaction gas, the type of reaction gas, etc.), for the same etching process, when a plurality of wafers 5 are etched, the maximum duration required for the upper electrode assembly 21 to adjust the reflected power to the range smaller than the target reflected power may be different. The maximum duration required for the above upper electrode assembly 21 to adjust the reflected power to the range smaller than the target reflected power may be, when the plurality of wafers 5 are etched, the maximum value of the durations required by the upper electrode assembly 21 to adjust the reflected power to the range smaller than the target reflected power. In embodiments of the present disclosure, the first preset duration may be set as large as possible to ensure that after the impedance matching of the upper electrode assembly 21 is completed (i.e., the first preset duration is reached), the reflected power of the upper electrode assembly 21 may be smaller than the target reflected power.

By taking an example that each of three wafers 5 is etched for one time, in the etching process of the three wafers 5, except that the durations required by the upper electrode assembly 21 to adjust the reflected power to the range smaller than the target reflected power are different, all other conditions may be the same. When the etching process is performed on a first wafer 5, the duration required by the upper electrode assembly 21 to adjust the reflected power to a range smaller than the target reflected power may be 2 seconds. When the etching process is performed on a second wafer 5, the duration required by the upper electrode assembly 21 to adjust the reflected power to a range smaller than the target reflected power may be 1 second. When the etching process is performed on a third wafer 5, the duration required by the upper electrode assembly 21 to adjust the reflected power to a range smaller than the target reflected power may be 3 seconds. Thus, by considering the first preset duration, the first preset duration should be greater than or equal to 3 seconds. Thus, after the impedance matching of the upper electrode assembly 21 is completed, the reflected power of the upper electrode assembly 21 may be ensured to be smaller than the target reflected power in the etching processes of the three wafers 5.

In some specific embodiments, the semiconductor process apparatus may further include a lower electrode assembly 22 configured to apply an RF bias voltage to the chuck 4 in the reaction chamber 1. The chuck 4 may be an electrostatic chuck. The controller may be further configured to, after controlling the upper electrode assembly 21 to perform the impedance matching of the first preset duration, control the lower electrode assembly 22 to apply the RF bias voltage to the chuck 4 and control the lower electrode assembly 22 to perform the impedance matching of a second preset duration.

In embodiments of the present disclosure, the first preset duration and the second preset duration may be the same or different and may be specifically determined according to actual needs. Before the lower electrode assembly 22 applies the RF bias voltage to the chuck 4, whether the power of the RF signal loaded by the lower electrode assembly 22 is greater than the preset power (for example, 5 W) may be determined first. If yes, the lower electrode assembly 22 may be caused to load the RF signal. If not, it means that the lower electrode assembly 22 does not need to be loaded with the RF signal. Therefore, the wafer 5 may be directly etched after the impedance matching of the upper electrode assembly 21 is completed.

It should be noted that, while the impedance matching is performed on the upper electrode assembly 21 and the lower electrode assembly 22, at least one of a flow volume of the introduced reaction gas, a chamber pressure, a current distribution ratio of the RF coil 213, or a temperature of the electrostatic chuck configured to carry the wafer 5 may be adjusted. The RF coil 213 may include an inner RF coil and an outer RF coil around the inner RF coil. A current ratio of the RF coil 213 may be a ratio of the current value of the inner RF coil to a sum of the current values of the inner RF coil and the outer RF coil.

In embodiments of the present disclosure, the chuck 4 may be arranged at the bottom of the reaction chamber 1. The lower electrode assembly 22 may include a second RF power supply 221 and a second matching device 222. The second RF power supply 221 may be electrically connected to the chuck 4 through the second matching device 222. The second RF power supply 221 may be configured to load the RF power to the chuck 4 to generate an RF bias voltage capable of attracting the plasma on the chuck 4. The second matching device 222 may be configured to perform the impedance matching.

In embodiments of the present disclosure, the second preset duration should be greater than or equal to the maximum duration required by the lower electrode assembly 22 to adjust the reflected power to a range smaller than the target reflected power. The reason may be the same as the reason that the first preset duration is greater than or equal to the maximum duration required by the lower electrode assembly 22 to adjust the reflected power to a range smaller than the target reflected power, which is not repeated here.

In some specific embodiments, the monitor 3 may be specifically configured to, according to the electromagnetic radiation intensity of the plasma in the reaction chamber 1, generate an analog signal that is positively correlated with the electromagnetic radiation intensity. The controller may be specifically configured to determine whether the analog signal generated by the monitor 3 within the preset monitor duration is continuously greater than the preset threshold. If yes, the electromagnetic radiation intensity of the plasma in the reaction chamber 1 may be determined to reach the preset intensity.

In embodiments of the present disclosure, an analog signal may be used to characterize the electromagnetic radiation intensity of the plasma in the reaction chamber 1, which may increase the collection frequency of the controller and may be beneficial to reduce the determination error of the controller. The analog signal may include a current signal and/or a voltage signal to meet different requirements of different controllers for input signals. For example, the controller may be configured to determine whether the current signal generated by the monitor 3 within the preset monitor duration is continuously greater than a preset current threshold, and/or the controller may be configured to determine whether the voltage signal generated by the monitor 3 within the preset monitor duration is continuously greater than the preset voltage threshold. If the controller determines that the current signal generated by the monitor 3 is continuously greater than the preset current threshold, and/or the voltage signal generated by the monitor 3 is continuously greater than the preset voltage threshold, the electromagnetic radiation intensity of the plasma in the reaction chamber 1 may be determined to reach the preset intensity.

In some specific embodiments, the preset monitor duration may be set within a range greater than or equal to 200 ms and less than or equal to 1000 ms. A ratio of the preset intensity to the target intensity may be greater than or equal to 1:10. The target intensity may be the electromagnetic radiation intensity that the plasma in the reaction chamber 1 may reach after the impedance matching of the upper electrode assembly 21 is completed.

In embodiments of the present disclosure, when the controller determines that the electromagnetic radiation intensity of the plasma in the reaction chamber 1 does not reach the preset intensity, an alarm signal may be issued. The alarm signal may be used to prompt the plasma ignition failure to facilitate the staff or the computer to take appropriate action. By using the above-preset monitor duration and preset intensity, the controller may determine whether the plasma is successfully ignited within a shortest possible duration to improve the timeliness and reliability of the controller.

In some specific embodiments, a monitor window H may be arranged on a sidewall of the plasma reaction chamber 1. The monitor 3 may be arranged outside of the reaction chamber 1. The monitor 3 may be configured to monitor the electromagnetic radiation intensity of the plasma in the reaction chamber 1 through the monitor window H.

In embodiments of the present disclosure, the monitor 3 may be arranged outside of the reaction chamber 1, which is easy to install. The monitor window H may be made of a non-metallic material, which facilitates the electromagnetic radiation of the plasma in the reaction chamber 1 to pass through to improve the monitor accuracy of the monitor 3.

Figure 4:
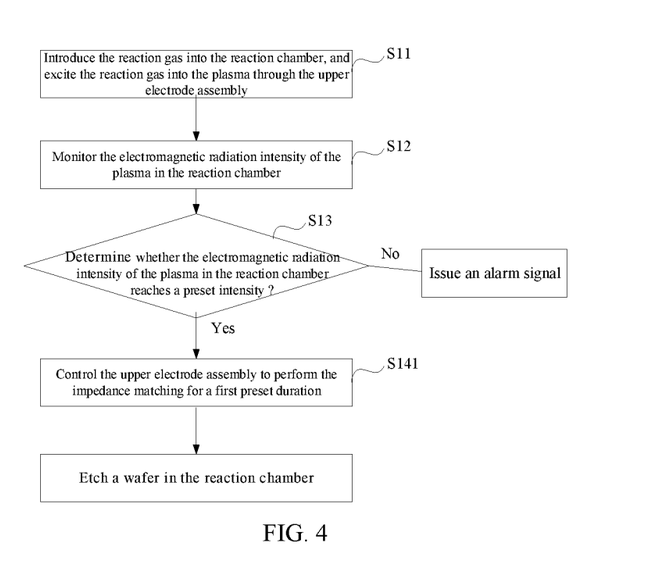
FIG. 4 illustrates a schematic flowchart of a plasma ignition method according to an embodiment of the present disclosure.

The present disclosure also provides a plasma ignition method. FIG. 4 illustrates a schematic flowchart of the plasma ignition method according to an embodiment of the present disclosure. As shown in FIG. 4, the plasma ignition method includes the following processes.

At S11, the reaction gas is introduced into the reaction chamber and excited into the plasma through the upper electrode assembly.

At S12, the electromagnetic radiation intensity of the plasma in the reaction chamber is monitored.

At S13, whether the electromagnetic radiation intensity of the plasma in the reaction chamber reaches a preset intensity is determined. If yes, the ignition is determined to be successful, and step S141 is performed.

At S141, the upper electrode assembly is controlled to perform the impedance matching for a first preset duration.

In embodiments of the present disclosure, the plasma ignition process is described in detail above and is not repeated here. It should be noted that, in this process, when it is determined that the plasma ignition is successful, the impedance matching of the first preset duration may be performed. When the plasma ignition is determined to fail, an alarm signal may be issued. The alarm signal may be used to prompt the failure of the plasma ignition.

In embodiments of the present disclosure, when the impedance matching is performed on the upper electrode assembly, at least one of the flow rate of the introduced reaction gas, the pressure of the reaction gas, or the temperature of the chuck configured to carry the wafer may be adjusted.

After step S141, the wafer in the reaction chamber may be etched. Specifically, the surface of the wafer may be bombarded by the plasma in the reaction chamber according to a target etching shape of the wafer to break the chemical bonds of the semiconductor material on the wafer. Thus, the semiconductor material of the wafer that needs to be etched off may react with the reaction gas to generate volatile substances to separate from the wafer.

With the plasma ignition method according to embodiments of the present disclosure, the impedance matching of the first preset duration may be performed after the plasma ignition is successful. Thus, the plasma ignition may be ensured to be successful before the impedance matching of the first preset duration is performed. After the plasma ignition is successful, the plasma may appear in the reaction chamber. Thus, since the duration of the impedance matching of the upper electrode assembly and the duration of the subsequent etching steps are both fixed, in the entire etching process, the duration of the plasma in the reaction chamber may be fixed to ensure the uniformity of the etching effect of different wafers.

Figure 5:
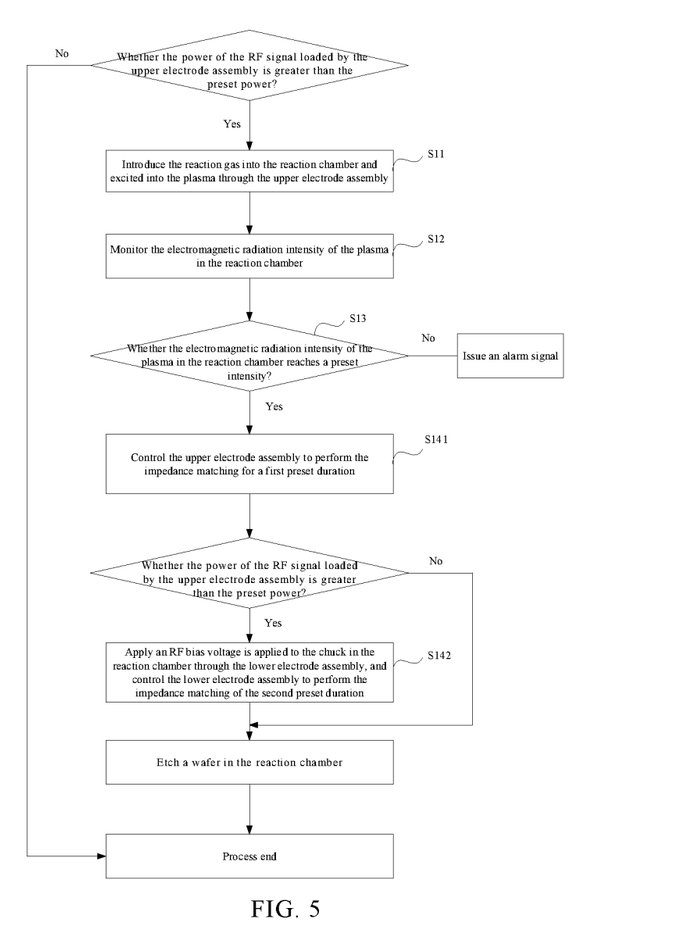
FIG. 5 illustrates a schematic flowchart of a plasma ignition method according to an embodiment of the present disclosure.

FIG. 5 illustrates a schematic flowchart of a plasma ignition method according to an embodiment of the present disclosure. As shown in FIG. 5, in some specific embodiments, after step S141, the plasma ignition method further includes the following processes.

At S142, a radio frequency bias voltage is applied to the chuck in the reaction chamber through the lower electrode assembly, and the lower electrode assembly is controlled to perform the impedance matching of the second preset duration.

In embodiments of the present invention, before performing step S11, whether the power of the RF signal loaded by the upper electrode assembly is greater than the preset power may be determined, such as 5 W. If yes, step S11 is performed. If no, it indicates that the upper electrode assembly 21 does not need to load the RF signal. Then, the process ends. Before step S142 is performed, whether the power of the RF signal loaded by the lower electrode assembly is greater than the preset power may be determined, for example, 5 W. If yes, step S142 is performed. If no, it indicates that the lower electrode assembly 22 does not need to load the RF signal. Then, the wafer may be etched.

In some specific embodiments, monitoring the electromagnetic radiation intensity of the plasma in the reaction chamber may include generating an analog signal positively correlated with the electromagnetic radiation intensity according to the electromagnetic radiation intensity of the plasma in the reaction chamber. Determining whether the electromagnetic radiation intensity of the plasma in the reaction chamber reaches the preset intensity may include determining whether the analog signal is continuously greater than the preset threshold within the preset monitor duration. If yes, the electromagnetic radiation intensity of the plasma in the reaction chamber may be determined to reach the preset intensity.

In some specific embodiments, the preset monitor duration may be greater than or equal to 200 ms and less than or equal to 1000 ms.

In some specific embodiments, a ratio of the preset intensity to the target intensity may be greater than or equal to 1:10. The target intensity may be the electromagnetic radiation intensity reached by the plasma in the reaction chamber after the impedance matching of the upper electrode assembly is completed.

It may be understood that the above embodiments are only exemplary embodiments used to illustrate the principle of the present disclosure. However, the present disclosure is not limited to this. For those of ordinary skill in the art, without departing from the spirit and essence of the present disclosure, various modifications and improvements may be made, and these modifications and improvements are also regarded as the scope of the present disclosure.

What is claimed is:

1. A semiconductor process apparatus, comprising:
a reaction chamber;
an air inlet assembly configured to introduce a reaction gas into the reaction chamber;
an upper electrode assembly configured to excite the reactive gas into a plasma, the upper electrode assembly including a first radio frequency (RF) power supply, a first matching device and an RF coil;
a monitor configured to monitor an electromagnetic radiation intensity of the plasma in the reaction chamber when the plasma is ignited; and
a controller configured to determine whether the electromagnetic radiation intensity monitored by the monitor reaches a preset intensity, in response to the electromagnetic radiation intensity monitored by the monitor reaching the preset intensity, determine that plasma ignition is successful, and after the plasma ignition is successful, control the upper electrode assembly to perform impedance matching of a first preset duration, the first preset duration being a fixed value, which is greater than or equal to a maximum duration required to complete the impedance matching, the maximum duration being a maximum value of durations required for the upper electrode assembly to adjust a reflected power to a range smaller than a target reflected power.

2. The semiconductor process apparatus of claim 1, further comprising:
a lower electrode assembly configured to apply a radio frequency (RF) bias voltage to a chuck in the reaction chamber;
wherein the controller is further configured to, after controlling the upper electrode assembly to perform the impedance matching of the first preset duration, control the lower electrode assembly to apply the RF bias voltage to the chuck, and control the lower electrode assembly to perform impedance matching of a second preset duration.

3. The semiconductor process apparatus according to claim 1, wherein,
the monitor is configured to generate an analog signal that is positively correlated with the electromagnetic radiation intensity according to the electromagnetic radiation intensity of the plasma in the reaction chamber; and
the controller is configured to determine whether the analog signal generated by the monitor within a preset monitor duration is continuously greater than a preset threshold, and if yes, determine that the electromagnetic radiation intensity of the plasma in the reaction chamber reaches a preset intensity.

4. The semiconductor process apparatus according to claim 3, wherein the preset monitor duration is greater than or equal to 200 ms and less than or equal to 1000 ms.

5. The semiconductor process apparatus according to claim 1, wherein:
a ratio of the preset intensity to a target intensity is greater than or equal to 1:10; and
the target intensity is the electromagnetic radiation intensity reached by the plasma in the reaction chamber after the impedance matching of the upper electrode assembly is completed.

6. The semiconductor process apparatus according to claim 1, wherein:
a monitor window is arranged on a sidewall of the reaction chamber;
the monitor is arranged outside the reaction chamber; and
the monitor is configured to monitor the electromagnetic radiation intensity of the plasma in the reaction chamber through the monitor window.

7. A plasma ignition method, comprising:
introducing a reaction gas into a reaction chamber;
exciting the reaction gas into a plasma through an upper electrode assembly, the upper electrode assembly including a first radio frequency (RF) power supply, a first matching device and an RF coil;
monitoring an electromagnetic radiation intensity of the plasma in the reaction chamber;
determining whether the electromagnetic radiation intensity of the plasma in the reaction chamber reaches a preset intensity, and in response to the electromagnetic radiation intensity monitored by a monitor reaching the preset intensity, determining that plasma ignition is successful; and
after the plasma ignition is successful, controlling the upper electrode assembly to perform impedance matching of a first preset duration, the first preset duration being a fixed value, which is greater than or equal to a maximum duration required to complete the impedance matching, the maximum duration being a maximum value of durations required for the upper electrode assembly to adjust a reflected power to a range smaller than a target reflected power.

8. The plasma ignition method according to claim 7, further comprising, after controlling the upper electrode assembly to perform the impedance matching of the first preset duration:
applying an RF bias voltage to a chuck in the reaction chamber through a lower electrode assembly; and
controlling the lower electrode assembly to perform impedance matching of a second preset duration.

9. The plasma ignition method according to claim 7, wherein,
monitoring the electromagnetic radiation intensity of the plasma in the reaction chamber includes:
according to the electromagnetic radiation intensity of the plasma in the reaction chamber, generating an analog signal that is positively correlated with the electromagnetic radiation intensity; and
determining whether the electromagnetic radiation intensity of the plasma in the reaction chamber reaches the preset intensity includes:
determining whether the analog signal is continuously greater than a preset threshold within a preset monitor duration, and in response to the electromagnetic radiation intensity monitored by the monitor reaching the preset intensity, determining that the electromagnetic radiation intensity of the plasma in the reaction chamber reaches the preset intensity.

10. The plasma ignition method according to claim 9, wherein the preset monitor duration is greater than or equal to 200 ms and less than or equal to 1000 ms.

11. A semiconductor process apparatus, comprising:
a reaction chamber;
an air inlet assembly configured to introduce a reaction gas into the reaction chamber;
an upper electrode assembly configured to excite the reactive gas into a plasma, the upper electrode assembly including a first radio frequency (RF) power supply, a first matching device and an RF coil;
a monitor configured to monitor an electromagnetic radiation intensity of the plasma in the reaction chamber when the plasma is ignited;
a controller configured to determine whether the electromagnetic radiation intensity monitored by the monitor reaches a preset intensity, in response to the electromagnetic radiation intensity monitored by the monitor reaching the preset intensity, determine that plasma ignition is successful, and after the plasma ignition is successful, control the upper electrode assembly to perform impedance matching of a first preset duration, the first preset duration being a fixed value, which is greater than or equal to a duration required to complete the impedance matching; and
a lower electrode assembly configured to apply a radio frequency (RF) bias voltage to a chuck in the reaction chamber, the lower electrode assembly including a second RF power supply and a second matching device.

* * * * *